USO09780195B2

(12) United States Patent
Chu et al.

(10) Patent No.: US 9,780,195 B2
(45) Date of Patent: Oct. 3, 2017

(54) NON-VOLATILE MEMORY AND FABRICATING METHOD THEREOF

(71) Applicant: Powerchip Technology Corporation, Hsinchu (TW)

(72) Inventors: Chien-Lung Chu, Hsinchu (TW); Chun-Hung Chen, Hsinchu County (TW); Ta-Chien Chiu, Miaoli County (TW)

(73) Assignee: Powerchip Tehnology Corporation, Hsinchu (TW)

( * ) Notice: Subject to any disclaimer, the term of this patent is extended or adjusted under 35 U.S.C. 154(b) by 153 days.

(21) Appl. No.: 14/639,087

(22) Filed: Mar. 4, 2015

(65) Prior Publication Data
US 2016/0190150 A1 Jun. 30, 2016

(30) Foreign Application Priority Data

Dec. 25, 2014 (TW) .............................. 103145465 A

(51) Int. Cl.
| | |
|---|---|
| *H01L 27/11* | (2006.01) |
| *H01L 29/66* | (2006.01) |
| *H01L 27/11565* | (2017.01) |
| *H01L 29/78* | (2006.01) |
| *H01L 27/1157* | (2017.01) |
| *H01L 27/11582* | (2017.01) |

(52) U.S. Cl.
CPC .... *H01L 29/66666* (2013.01); *H01L 27/1157* (2013.01); *H01L 27/11565* (2013.01); *H01L 27/11582* (2013.01); *H01L 29/7827* (2013.01)

(58) Field of Classification Search
CPC ....... H01L 29/66; H01L 29/79; H01L 29/668; H01L 29/792; H01L 29/66833; H01L 27/11; H01L 27/115; H01L 27/11568; H01L 21/28; H01L 21/28281
USPC .......................................... 438/268; 257/324
See application file for complete search history.

(56) References Cited

U.S. PATENT DOCUMENTS

| | | |
|---|---|---|
| 7,005,350 B2 | 2/2006 | Walker et al. |
| 8,203,187 B2 | 6/2012 | Lung et al. |
| 8,482,055 B2 | 7/2013 | Choi et al. |

(Continued)

OTHER PUBLICATIONS

Seiichi Aritome, et al., "Advanced DC-SF Cell Technology for 3-D NAND Flash," IEEE Transactions on Electron Devices, vol. 60, No. 4, Apr. 2013, pp. 1327-pp. 1333.

(Continued)

*Primary Examiner* — Monica D Harrison
(74) *Attorney, Agent, or Firm* — Jianq Chyun IP Office

(57) ABSTRACT

A non-volatile memory includes a substrate, a stacked structure, a channel layer, and a second dielectric layer. The stacked structure includes a first dielectric layer and a plurality of memory cells. The first dielectric layer is disposed on the substrate. The memory cells are stacked on the first dielectric layer. Each of the memory cells includes two first conductive layers and a charge storage structure. The charge storage structure is disposed between the two first conductive layers. The charge storage structures in the vertically adjacent memory cells are separated from each other. The channel layer is disposed on a sidewall of the stacked structure and connected to the substrate. The second dielectric layer is disposed between the channel layer and the first conductive layers.

17 Claims, 8 Drawing Sheets

(56) References Cited

U.S. PATENT DOCUMENTS

| | | |
|---|---|---|
| 8,487,450 B2 | 7/2013 | Mouli |
| 8,502,300 B2 | 8/2013 | Fukuda et al. |
| 8,513,725 B2 | 8/2013 | Sakuma et al. |
| 8,610,193 B2 | 12/2013 | Ramaswamy |
| 8,643,078 B2 | 2/2014 | Chen et al. |
| 8,644,077 B2 | 2/2014 | Lue et al. |
| 8,681,555 B2 | 3/2014 | Liu |
| 8,742,488 B2 | 6/2014 | Lee et al. |
| 8,755,223 B2 | 6/2014 | Scheuerlein |
| 8,829,591 B2 * | 9/2014 | Alsmeier .......... H01L 27/11551 257/316 |
| 2013/0248977 A1 | 9/2013 | Mori et al. |
| 2016/0064407 A1 * | 3/2016 | Kim ................. H01L 27/11556 257/324 |

OTHER PUBLICATIONS

Yoohyun Noh, et al., "A New Metal Control Gate Last Process (MCGL process) for High Performance DC-SF (Dual Control gate with Surrounding Floating gate) 3D NAND Flash Memory," 2012 Symposium on VLSI Technology (VLSIT), Jun. 12-14, 2012, pp. 19-pp. 20.

Hyunseung Yoo, et al., "New read scheme of variable Vpass-read for Dual Control gate with Surrounding Floating gate (DC-SF) NAND flash cell," 2011 3rd IEEE International Memory Workshop (IMW), May 22-25, 2011, pp. 1-pp. 4.

Sungjin Whang, et al., "Novel 3-Dimensional Dual Control-Gate with Surrounding Floating-Gate (DC-SF) NAND Flash Cell for 1Tb File Storage Application," 2010 IEEE International Electron Devices Meeting (IEDM), Dec. 6-8, 2010, pp. 29.7.1-pp. 29.7.4.

* cited by examiner

NON-VOLATILE MEMORY AND FABRICATING METHOD THEREOF

CROSS-REFERENCE TO RELATED APPLICATION

This application claims the priority benefit of Taiwan application serial no. 103145465, filed on Dec. 25, 2014. The entirety of the above-mentioned patent application is hereby incorporated by reference herein and made a part of this specification.

BACKGROUND OF THE INVENTION

Field of the Invention

The invention relates to a memory and a fabricating method thereof; more particularly, the invention relates to a non-volatile memory and a fabricating method thereof.

Description of Related Art

With the advantage of safeguarding the written data even after the power is off, non-volatile memory devices have been widely used in personal computers and electronic instruments.

At present, structures of flash memory arrays commonly applied in the pertinent field include an NOR-type array structure and an NAND-type array structure. In the NAND-type array non-volatile memory structure, each of the memory cells is serially connected, and the level of integration and the area utilization of the NAND-type array non-volatile memory structure are greater than those of the NOR-type array non-volatile memory, and thus the NAND-type array non-volatile memory structure has been extensively employed in various kinds of electronic products.

In response to the present trend of miniaturizing devices, how to further increase the level of integration of the memory device within a limited space has drawn great attention from the industry.

SUMMARY OF THE INVENTION

The invention is directed to a non-volatile memory and a fabricating method thereof, which are conductive to an increase in the level of integration of memory devices.

In an embodiment of the invention, a non-volatile memory that includes a substrate, a stacked structure, a channel layer, and a second dielectric layer is provided. The stacked structure includes a first dielectric layer and a plurality of memory cells. The first dielectric layer is disposed on the substrate. The memory cells are stacked on the first dielectric layer. Each of the memory cells includes two first conductive layers and a charge storage structure. The charge storage structure is disposed between the two first conductive layers. The charge storage structures in vertically adjacent memory cells are separated from each other. The channel layer is disposed on a sidewall of the stacked structure and connected to the substrate. The second dielectric layer is disposed between the channel layer and the first conductive layers.

According to an embodiment of the invention, in the non-volatile memory, two vertically adjacent memory cells of the memory cells share one of the first conductive layers located between the two vertically adjacent memory cells.

According to an embodiment of the invention, in the non-volatile memory, each of the charge storage structures includes a third dielectric layer, a fourth dielectric layer, and a charge storage layer. The third dielectric layer is disposed on each of the first conductive layers. The fourth dielectric layer is disposed on the third dielectric layer. The charge storage layer is disposed between the third dielectric layer and the fourth dielectric layer.

According to an embodiment of the invention, in the non-volatile memory, each of the charge storage layers is a charge trapping layer, for instance.

According to an embodiment of the invention, in the non-volatile memory, the channel layer includes a primary channel layer and a spacer channel layer. The primary channel layer is disposed on one side of the stacked structure. The spacer channel layer is disposed between the stacked structure and the primary channel layer.

According to an embodiment of the invention, the non-volatile memory further includes a doped region disposed in the substrate below the channel layer.

According to an embodiment of the invention, the non-volatile memory further includes a conductive wire disposed on the stacked structure and connected to the channel layer.

According to an embodiment of the invention, in the non-volatile memory, the conductive wire and the channel layer are integrally formed or independent from each other, for instance.

According to an embodiment of the invention, in the non-volatile memory, the stacked structure further includes a second conductive layer disposed between the first dielectric layer and a bottommost first conductive layer of the first conductive layers in the stacked structure. The second conductive layer is electrically isolated from the bottommost first conductive layer in the stacked structure, for instance.

According to an embodiment of the invention, in the non-volatile memory, the stacked structure further includes a third conductive layer disposed on a topmost first conductive layer of the first conductive layers in the stacked structure. The third conductive layer is electrically isolated from the topmost first conductive layer in the stacked structure, for instance.

In an embodiment of the invention, a fabricating method of a non-volatile memory is provided, and the fabricating method includes following steps. A stacked structure is formed on a substrate. The stacked structure includes a first dielectric layer and a plurality of memory cells. The first dielectric layer is disposed on the substrate. The memory cells are stacked on the first dielectric layer. Each of the memory cells includes two first conductive layers and a charge storage structure. The charge storage structure is disposed between the two first conductive layers. The charge storage structures in vertically adjacent memory cells are separated from each other. A channel layer is formed on a sidewall of the stacked structure. The channel layer is connected to the substrate. A second dielectric layer is formed between the channel layer and the first conductive layers.

According to an embodiment of the invention, in the fabricating method, a method of forming the stacked structure includes following steps. A first dielectric material layer is formed on the substrate. A plurality of first conductive material layers and a plurality of charge storage structure layers are alternately formed on the first dielectric material layer. A patterning process is performed on the first conductive material layers, the charge storage structure layers, and the first dielectric material layer.

According to an embodiment of the invention, in the fabricating method, a method of forming each of the charge storage structure layers includes following steps. A third dielectric material layer is formed on each of the first conductive material layers. A charge storage material layer is formed on the third dielectric material layer. A fourth dielectric material layer is formed on the charge storage material layer.

According to an embodiment of the invention, in the fabricating method, the patterning process includes forming an opening in the first conductive material layers, the charge storage structure layers, and the first dielectric material layer, and the opening exposes the substrate.

According to an embodiment of the invention, in the fabricating method, a method of forming the channel layer includes following steps. A spacer channel layer is formed on the second dielectric layer on the sidewall of the stacked structure. A primary channel layer that fills the opening is formed.

According to an embodiment of the invention, the fabricating method further includes forming a doped region in the substrate below the channel layer.

According to an embodiment of the invention, the fabricating method further includes forming a conductive wire on the stacked structure, and the conductive wire is connected to the channel layer.

According to an embodiment of the invention, in the fabricating method, the conductive wire and the channel layer are integrally formed or independent from each other.

According to an embodiment of the invention, the fabricating method further includes forming a second conductive layer between the first dielectric layer and a bottommost first conductive layer of the first conductive layers in the stacked structure. The second conductive layer is electrically isolated from the bottommost first conductive layer in the stacked structure, for instance.

According to an embodiment of the invention, the fabricating method further includes forming a third conductive layer on a topmost first conductive layer of the first conductive layers in the stacked structure. The third conductive layer is electrically isolated from the topmost first conductive layer in the stacked structure, for instance.

As provided above, the non-volatile memory and the fabricating method of the invention contribute to an effective increase in the level of integration of memory devices through stacking the first conductive layers and the charge storage structures of plural memory cells and using the flat-type charge storage structures and the vertical-type channel layer together.

Several exemplary embodiments accompanied with figures are described in detail below to further describe the invention in details.

DETAILED DESCRIPTION OF DISCLOSED EMBODIMENTS

FIG. 1A to FIG. 1F are cross-sectional diagrams illustrating a fabricating process of a non-volatile memory according to an embodiment of the invention.

Figure 1A:
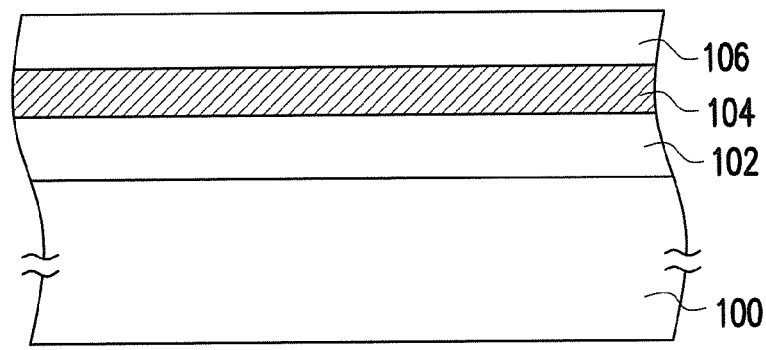
FIG. 1A to FIG. 1F are cross-sectional diagrams illustrating a fabricating process of a non-volatile memory according to an embodiment of the invention.

With reference to FIG. 1A, a dielectric material layer 102 is formed on a substrate 100. The substrate 100 is, for instance, a silicon substrate. The dielectric material layer 102 is made of silicon oxide, for instance. The dielectric material layer 102 is formed by performing a chemical vapor deposition (CVD) process or a thermal oxidation process, for instance.

A conductive material layer 104 may be optionally formed on the dielectric material layer 102. The material of the conductive material layer 104 is, for instance, doped polysilicon, and the conductive material layer 104 may be formed by performing a CVD process, for instance.

A dielectric material layer 106 may be optionally formed on the conductive material layer 104. The dielectric material layer 106 is made of silicon oxide, for instance. The dielectric material layer 106 is formed by performing a CVD process, for instance.

Figure 1B:
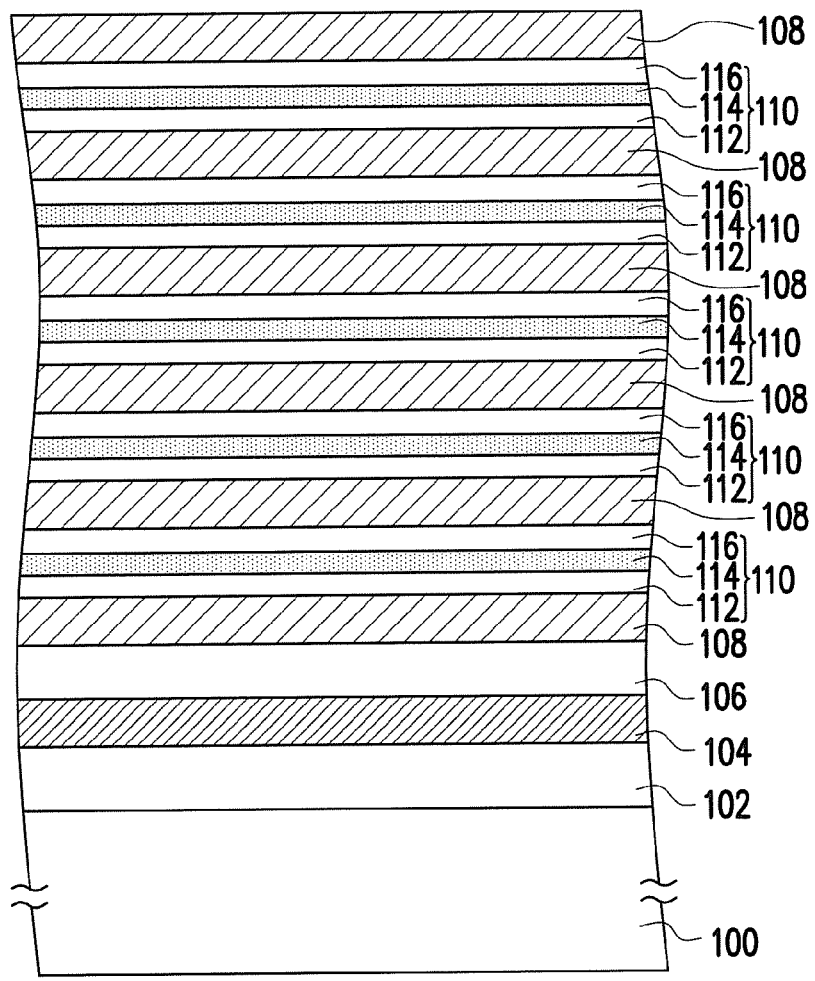

With reference to FIG. 1B, plural first conductive material layers 108 and plural charge storage structure layers 110 are alternately formed on the dielectric material layer 106. In the present embodiment, six conductive material layers 108 and five charge storage structure layers 110 are exemplified to explain the invention, and this should by no means restrict the scope of the invention. People having ordinary skill in the pertinent art may, according to the actual product requirements, adjust the number of conductive material layers 108 and the number of the charge storage structure layers 110.

The material of the conductive material layer 108 is, for instance, doped polysilicon, and the conductive material layer 108 is formed by performing a CVD process, for instance.

Each charge storage structure layer 110 is formed by performing following steps. A dielectric material layer 112 is formed on each of the conductive material layers 108. A charge storage material layer 114 is formed on the dielectric material layer 112. A dielectric material layer 116 is formed on the charge storage material layer 114. The material of the dielectric material layers 112 and 116 is silicon oxide, for instance. The dielectric material layers 112 and 116 are formed by performing a CVD process or a thermal oxidation process, for instance. The charge storage material layer 114 is made of a charge trapping material, e.g., silicon nitride. The charge storage material layer 114 is, for instance, formed by performing a CVD process.

Figure 1C:
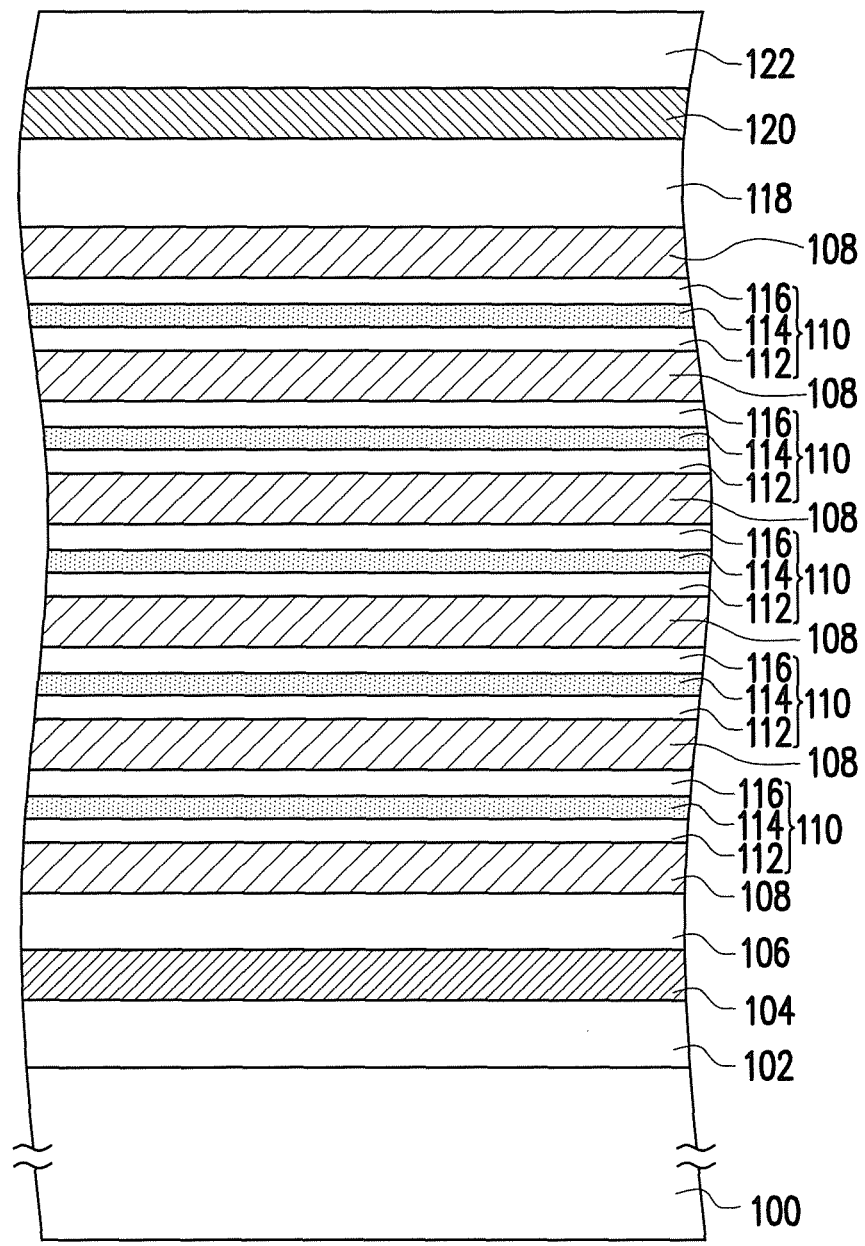

With reference to FIG. 1C, a dielectric material layer 118 may be optionally formed on the conductive material layer 108. The dielectric material layer 118 is made of silicon oxide, for instance. The dielectric material layer 118 is formed by performing a CVD process, for instance.

A conductive material layer 120 may be optionally formed on the dielectric material layer 118. The material of the conductive material layer 120 is, for instance, doped polysilicon, and the conductive material layer 120 is formed by performing a CVD process, for instance.

A dielectric material layer 122 may be optionally formed on the conductive material layer 120. The dielectric material layer 122 is made of silicon oxide, for instance. The dielectric material layer 122 is formed by performing a CVD process, for instance.

Figure 1D:
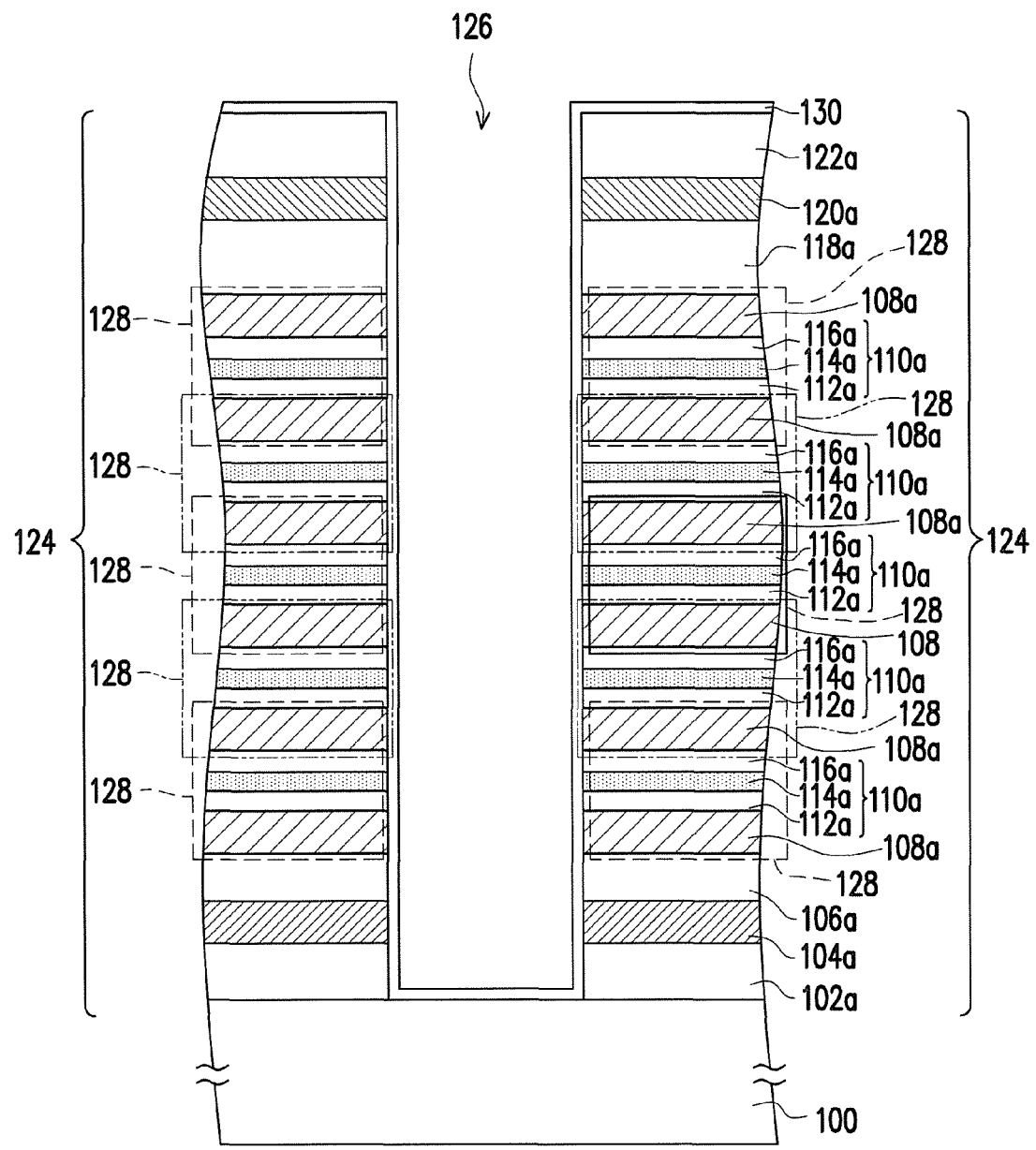

With reference to FIG. 1D, a patterning process is performed on the dielectric material layer 122, the conductive material layer 120, the dielectric material layer 118, the conductive material layer 108, the charge storage structure layer 110, the dielectric material layer 106, the conductive material layer 104, and the dielectric material layer 102, so as to form stacked structures 124. Each of the stacked structures 124 includes a dielectric layer 122a, a conductive layer 120a, a dielectric layer 118a, conductive layers 108a, charge storage structures 110a, a dielectric layer 106a, a conductive layer 104a, and a dielectric layer 102a. Each of the charge storage structures 110a includes a dielectric layer 112a, a charge storage layer 114a, and a dielectric layer 116a. In the present embodiment, two stacked structures 124 are formed, for instance, which should however not be construed as a limitation to the invention. Formation of at least one stacked structure 124 would fall within the scope of the invention and do not depart from the spirit of the invention. People having ordinary skill in the pertinent art may, according to the actual product requirements, adjust the number of the stacked structures 124.

Besides, during the patterning process, an opening 126 that exposes the substrate 100 is formed in the dielectric material layer 122, the conductive material layer 120, the dielectric material layer 118, the conductive material layers 108, the charge storage structure layers 110, the dielectric material layer 106, the conductive material layer 104, and the dielectric material layer 102. The patterning process is a photolithography and etching process (PEP), for instance.

In addition, memory cells 128 are formed by two adjacent conductive layers 108a and the charge storage structure 110a located between the two adjacent conductive layers 108a. The conductive layers 108a may serve as control gates. The conductive layers 120a and 104a may respectively serve as select gates. In the present embodiment, five memory cells 128 are formed in one stacked structure 124, and this should by no means restrict the scope of the invention. People having ordinary skill in the pertinent art may, according to the actual product requirements, adjust the number of the memory cells 128.

A dielectric material layer 130 is conformally formed on the opening 126. The dielectric material layer 130 is made of silicon oxide, for instance. The dielectric material layer 130 is formed by performing a CVD process or a thermal oxidation process, for instance.

Figure 1E:
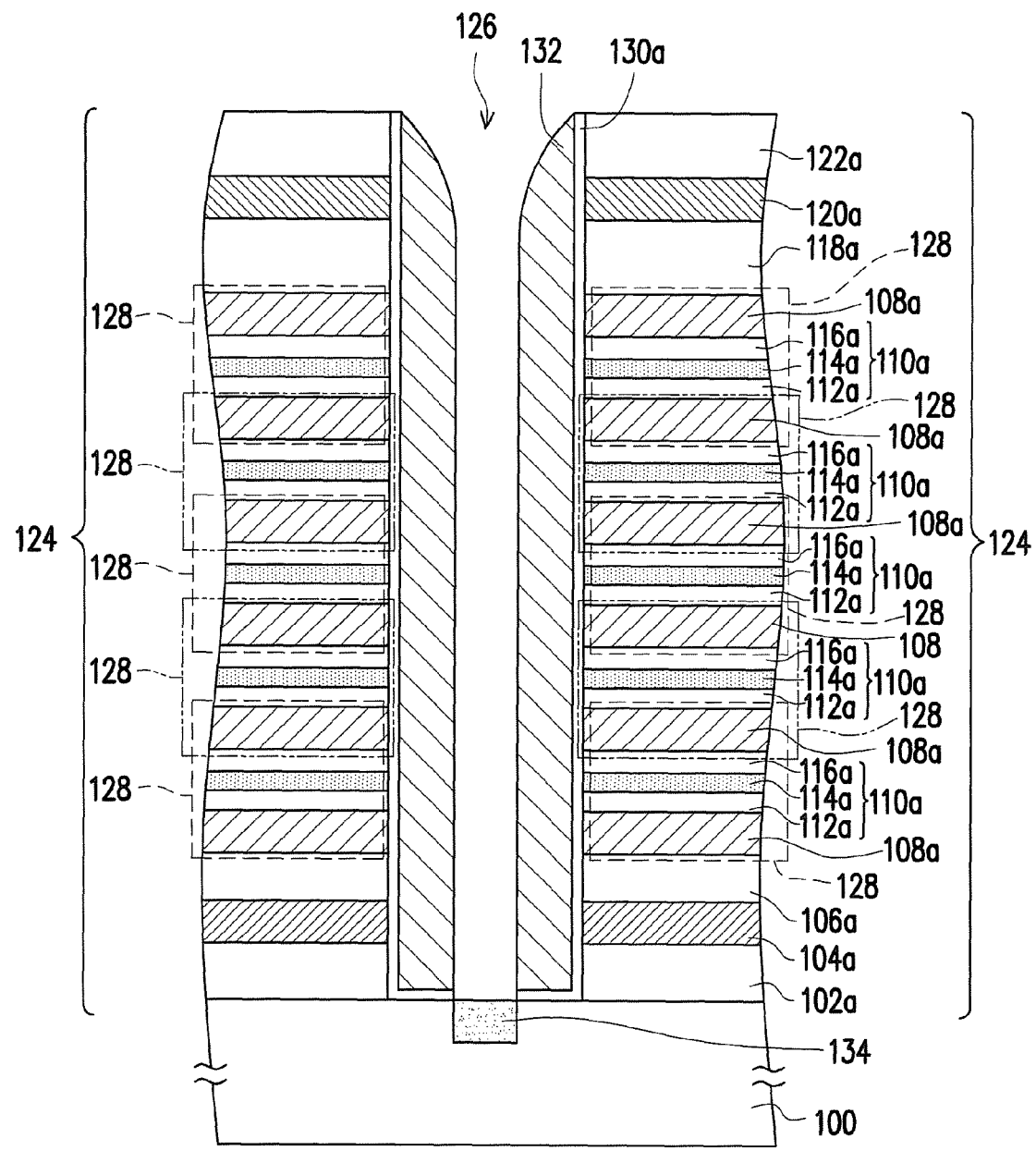

With reference to FIG. 1E, a spacer channel layer 132 is formed on the dielectric material layer 130 on sidewalls of the stacked structures 124. The spacer channel layer 132 is made of polysilicon, for instance. The spacer channel layer 132 is formed by conformally forming a channel material layer (not shown) in the opening 126 and by performing an etching back process on the channel material layer, for instance. The etching back process is, for instance, a dry etching process.

An etching back process is performed on the dielectric material layer 130, and the dielectric material layer 130 that is not covered by the spacer channel layer 132 is removed, so as to form a dielectric layer 130a that exposes the substrate 100. The etching back process is, for instance, a dry etching process.

A doped region 134 is formed in the exposed substrate 100. The doped region 134 may act as a source line, and the doped region 134 may be formed by performing an ion implantation process, for instance.

Figure 1F:
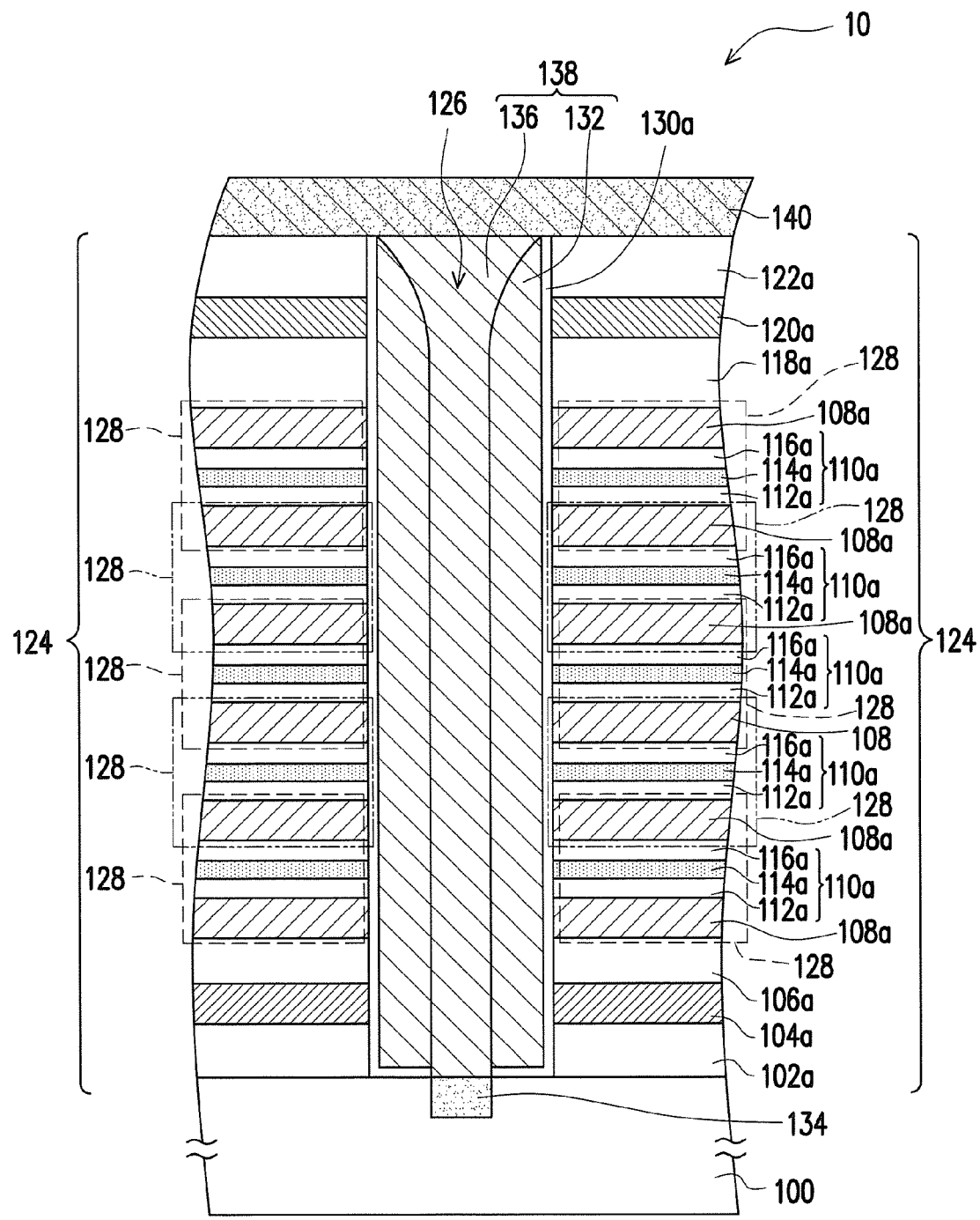

With reference to FIG. 1F, a primary channel layer 136 is formed, and the opening 126 is filled with the primary channel layer 136. The primary channel layer 136 is connected to the doped region 134 in the substrate 100. The primary channel layer 136 and the spacer channel layer 132 together constitute the channel layer 138. The primary channel layer 136 is made of polysilicon, for instance. The primary channel layer 136 is formed by performing a CVD process, for instance.

A conductive wire 140 that is connected to the channel layer 138 is formed on the stacked structures 124. The conductive wire 140 is made of a conductive material, e.g., doped polysilicon, and the conductive wire 140 is formed by performing a CVD process, for instance. The conductive wire 140 and the primary channel layer 136 of the channel layer 138 are integrally formed or independently formed.

After said fabricating method is applied, the NOR-type array non-volatile memory 10 is formed. The structure of the non-volatile memory 10 provided in the present embodiment is described below with reference to FIG. 1F.

As shown in FIG. 1F, the non-volatile memory 10 includes the substrate 100, the stacked structures 124, the channel layer 138, and the dielectric layer 130a. Each of the stacked structures 124 includes the dielectric layer 102a and the memory cells 128. The dielectric layer 102a is disposed on the substrate 100. The memory cells 128 are stacked on the dielectric layer 102a. Each of the memory cells 128 includes two conductive layers 108a and one charge storage structure 110a. The charge storage structure 110a is disposed between the two conductive layers 108a. The charge storage structures 110a in the vertically adjacent memory cells 128 are separated from each other. Every two vertically adjacent memory cells 128 may share the conductive layer 108a located therebetween. Each of the charge storage structures 110a includes the dielectric layer 112a, the charge storage layer 114a, and the dielectric layer 116a. Each dielectric layer 112a is disposed on each conductive layer 108a. The dielectric layer 116a is disposed on the dielectric layer 112a. The charge storage layer 114a is disposed between the dielectric layer 112a and the dielectric layer 116a. For instance, the charge storage layer 114a is a charge trapping layer. The channel layer 138 is disposed on the sidewalls of the stacked structures 124 and connected to the substrate 100. Here, the channel layer 138 includes the primary channel layer 136 and the spacer channel layer 132. The primary channel layer 136 is disposed on one side of each of the stacked structures 124. The spacer channel layer 132 is disposed between the stacked structures 124 and the primary channel layer 136. The dielectric layer 130a is disposed between the channel layer 138 and the conductive layers 108a and may further extend between the channel layer 138 and the conductive layers 104a and between the channel layer 138 and the conductive layers 120a.

In addition, the non-volatile memory 10 may optionally include at least one of the doped region 134, the conductive wire 140, the dielectric layer 122a, the conductive layer 104a, the dielectric layer 106a, the conductive layer 120a, and the dielectric layer 118a. The doped region 134 is disposed in the substrate 100 below the channel layer 138 and may be connected to the channel layer 138. The conductive wire 140 that is connected to the channel layer 138 is formed on the stacked structures 124. The conductive wire 140 and the conductive layer 120a in each of the stacked structures 124 are electrically isolated from each other by the dielectric layer 122a, for instance. The conductive wire 140 and the channel layer 138 are integrally formed or independent from each other, for instance. The conductive layer 104a is disposed between the dielectric layer 102a and the bottommost conductive layer 108a in each of the stacked structures 124. The conductive layer 104a and the bottommost conductive layer 108a in each of the stacked structures 124 are electrically isolated from each other by the dielectric layer 106a. The conductive layer 120a is disposed on the uppermost conductive layer 108a in each of the stacked structures 124. The conductive layer 120a and the uppermost conductive layer 108a in each of the stacked structures 124 are electrically isolated from each other by the dielectric layer 118a.

The material, the arrangement, the effects, and the fabricating method of each component of the non-volatile memory 10 are described above and shown in FIG. 1A to FIG. 1F, and hence no further description is provided hereinafter.

To sum up, the non-volatile memory 10 and the fabricating method provided in the above embodiments contribute to an effective increase in the level of integration of memory devices through stacking the conductive layers 108a and the charge storage structures 110a of the plural memory cells 128 and using the flat-type charge storage structures 110a and the vertical-type channel layer 138 together.

Figure 2:
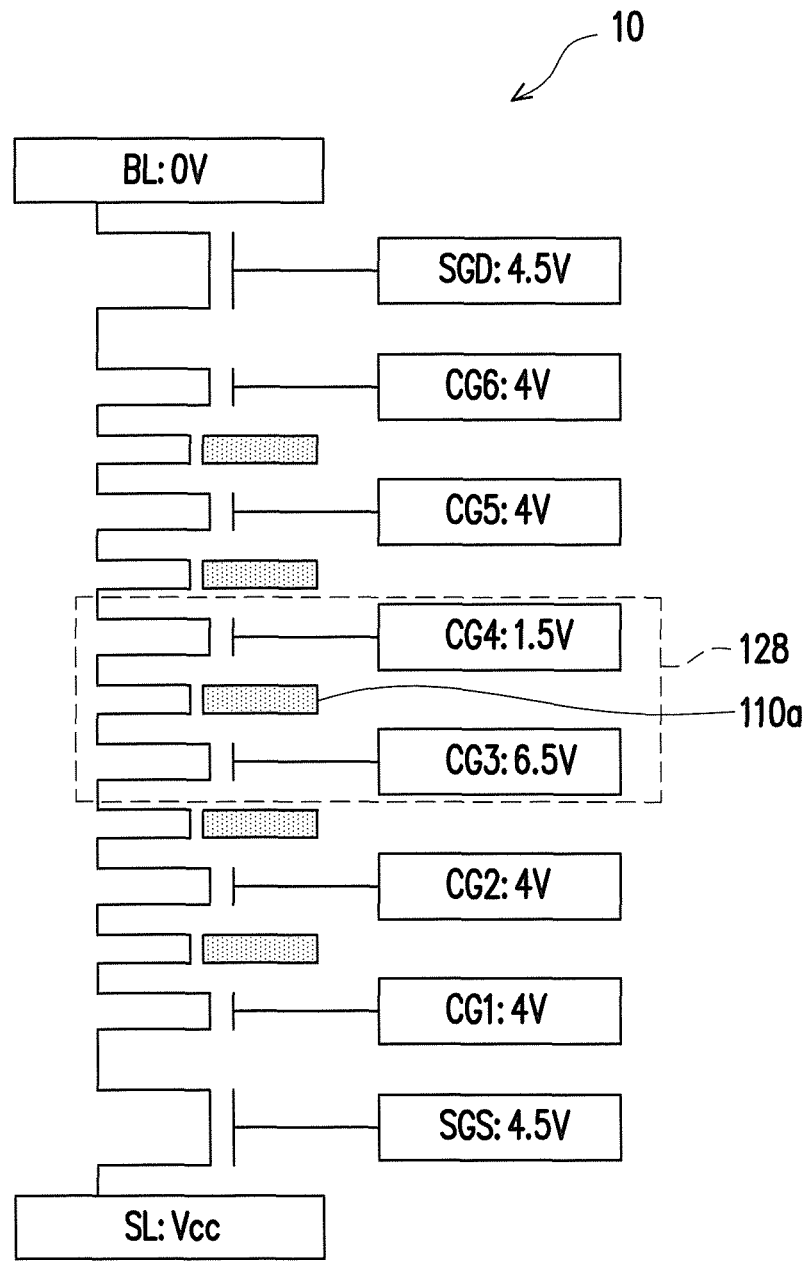
FIG. 2 is a brief circuit diagram while a programming operation is being performed on the non-volatile memory depicted in FIG. 1F.
Figure 3:
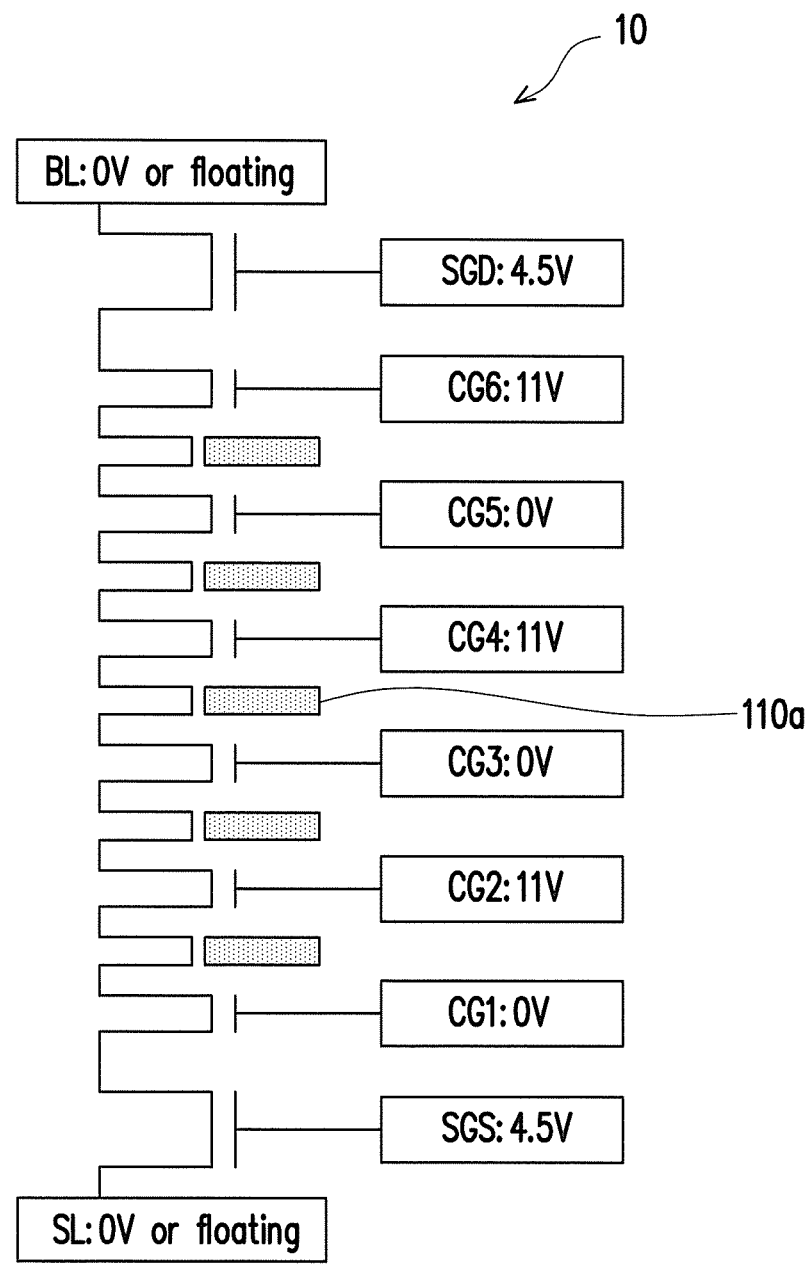
FIG. 3 is a brief circuit diagram while an erasing operation is being performed on the non-volatile memory depicted in FIG. 1F.
Figure 4:
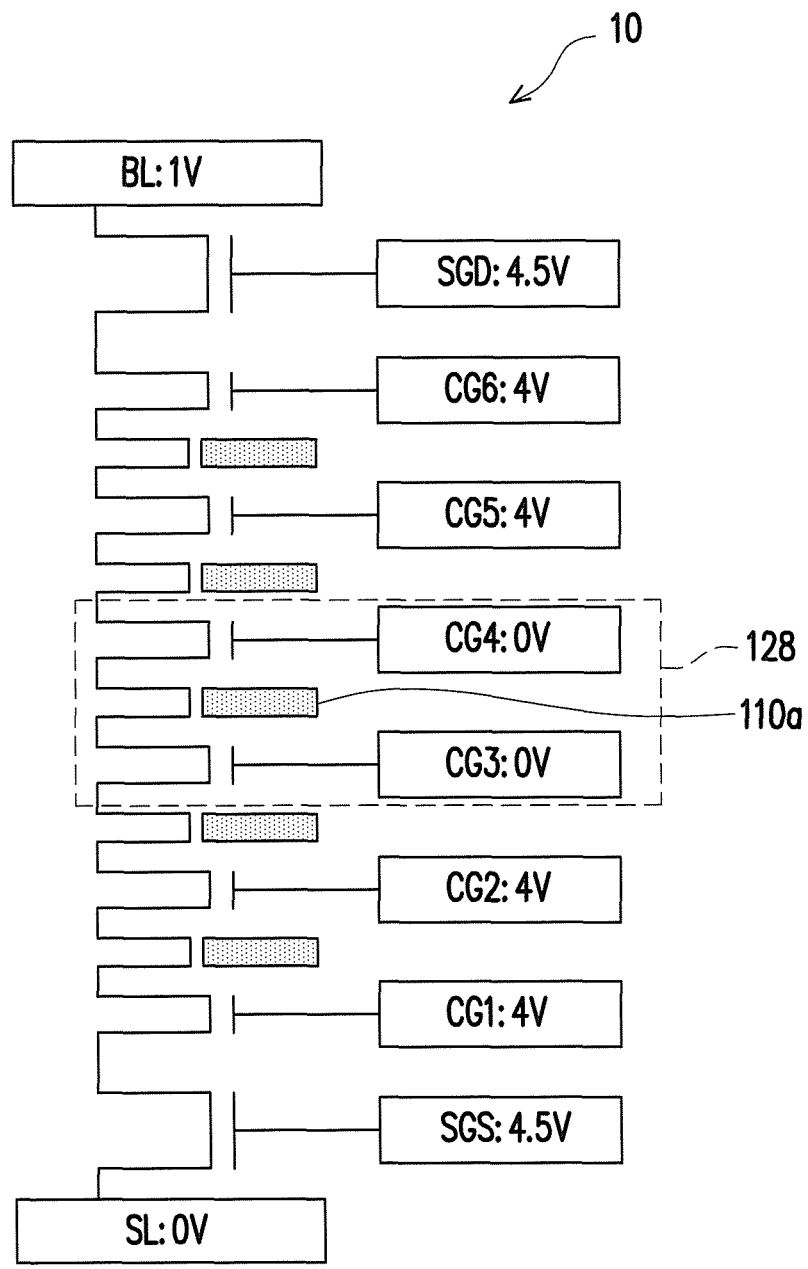
FIG. 4 is a brief circuit diagram while a reading operation is being performed on the non-volatile memory depicted in FIG. 1F.

FIG. 2 is a brief circuit diagram while a programming operation is being performed on the non-volatile memory depicted in FIG. 1F. FIG. 3 is a brief circuit diagram while an erasing operation is being performed on the non-volatile memory depicted in FIG. 1F. FIG. 4 is a brief circuit diagram while a reading operation is being performed on the non-volatile memory depicted in FIG. 1F. The way to operate the non-volatile memory 10 provided in the present embodiment is described below with reference to FIG. 2 to FIG. 4. In FIG. 2 and FIG. 4, one NAND memory cell string selected for operation is shown.

With reference to FIG. 1F and FIG. 2 to FIG. 4, the conductive layers 108a are set as control gates CG1 to CG6. The doped region 134 is set as a source line SL. The conductive wire 140 is set as a word line BL. The conductive layers 104a and 120a are respectively set as a select gate SGS and a select gate SGD.

With reference to FIG. 2, while a programming operation is performed on the selected memory cell 128 (the dashed region in FIG. 2), electrical charges may be injected into the charge storage structure 110a through source-side injection and the selected memory cell 128 may be programmed, so as to ensure low voltage operation and prevent overly wide distribution of the threshold voltage.

For instance, voltages applied during the programming operation on the selected memory cell 128 (the dashed region in FIG. 2) are explained below. An operating voltage Vcc is applied to the source line SL, 0 V is applied to the word line BL, 4.5 V is applied to the select gates SGS and SGD, respectively, 6.5 V and 1.5 V are respectively applied to the control gates CG3 and CG4 in the selected memory cell 128, and 4 V is applied to the other control gates CG1, CG2, CG5, and CG6, respectively. However, people having ordinary skill in the pertinent art may adjust the voltages according to the actual requirements for the programming operation.

With reference to FIG. 3, while an erasing operation is performed on the non-volatile memory 10, a page erase is performed on the entire NAND memory cell string of the non-volatile memory 10. Specifically, the page erase may be performed by erasing electrical charges stored in the charge storage structures 110a through Fowler-Nordheim tunneling. During the erasing operation, the electrical charges are moved on the erasing path between the control gates CG1 to CG6 and the charge storage structures 110a.

For instance, voltages applied during the erasing operation on the entire NAND memory cell string in the non-volatile memory 10 are explained below. 0V is applied to the source line SL and the word line BL or the source line SL and the word line BL is floating, 4.5 V is applied to the select gates SGS and SGD, respectively, 0 V is applied to the control gates CG1, CG3, and CG5, respectively, and 11 V is applied to the other control gates CG2, CG4, and CG6, respectively. However, people having ordinary skill in the pertinent art may adjust the voltages according to the actual requirements for the erasing operation.

With reference to FIG. 4, voltages applied to the control gates CG3 and CG4 during a reading operation on the selected memory cell 128 (the dashed region in FIG. 4) have the following properties. The voltages applied to the control gates CG3 and CG4 do not turn on the channel located below the control gates CG3 and CG4, while whether the charge storage structure 110a stores the electrical charges can still be detected due to the high sensitivity.

For instance, voltages applied during the reading operation on the selected memory cell 128 (the dashed region in FIG. 4) are explained below. 0 V is applied to the source line SL, 1 V is applied to the word line BL, 4.5 V is applied to the select gates SGS and SGD, respectively, 0 V is applied to the control gates CG3 and CG4 in the selected memory cell 128, respectively, and 4 V is applied to the other control gates CG1, CG2, CG5, and CG6, respectively. However, people having ordinary skill in the pertinent art may adjust the voltages according to the actual requirements for the reading operation.

In summary, the non-volatile memory and the fabricating method thereof as provided above have at least the following advantages. Through stacking the conductive layers and the charge storage structures of the plural memory cells and through using the flat-type charge storage structures and the vertical-type channel layer together, the level of integration of memory devices can be effectively raised.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. A non-volatile memory comprising:
   a substrate;
   a stacked structure comprising:
     a first dielectric layer disposed on the substrate; and
     a plurality of memory cells stacked on the first dielectric layer, each of the memory cells comprising:
       two first conductive layers; and
       a charge storage structure disposed between the two first conductive layers, wherein the charge storage structures in vertically adjacent memory cells are separated from each other;
   a channel layer disposed on a sidewall of the stacked structure and connected to the substrate; and
   a second dielectric layer disposed between the channel layer and the first conductive layers,
   wherein each of the charge storage structures comprises:
     a third dielectric layer disposed on each of the first conductive layers;
     a fourth dielectric layer disposed on the third dielectric layer; and
     a charge storage layer disposed between the third dielectric layer and the fourth dielectric layer.

2. The non-volatile memory according to claim 1, wherein two vertically adjacent memory cells of the memory cells share one of the first conductive layers located between the two vertically adjacent memory cells.

3. The non-volatile memory according to claim 1, wherein each of the charge storage layers comprises a charge trapping layer.

4. The non-volatile memory according to claim 1, wherein the channel layer comprises:
   a primary channel layer disposed on one side of the stacked structure; and
   a spacer channel layer disposed between the stacked structure and the primary channel layer.

5. The non-volatile memory according to claim 1, further comprising a doped region disposed in the substrate below the channel layer.

6. The non-volatile memory according to claim 1, further comprising a conductive wire disposed on the stacked structure and connected to the channel layer.

7. The non-volatile memory according to claim 6, wherein the conductive wire and the channel layer are integrally formed or independent from each other.

8. The non-volatile memory according to claim 1, wherein the stacked structure further comprises a second conductive layer disposed between the first dielectric layer and a bottommost first conductive layer of the first conductive layers in the stacked structure, and the second conductive layer is electrically isolated from the bottommost first conductive layer in the stacked structure.

9. The non-volatile memory according to claim 1, wherein the stacked structure further comprises a third conductive layer disposed on a topmost first conductive layer of the first conductive layers in the stacked structure, and the third conductive layer is electrically isolated from the topmost first conductive layer in the stacked structure.

10. A fabricating method of a non-volatile memory, comprising:
    forming a stacked structure on a substrate, the stacked structure comprising:
    a first dielectric layer disposed on the substrate; and
    a plurality of memory cells stacked on the first dielectric layer, each of the memory cells comprising:
    two first conductive layers; and
    a charge storage structure disposed between the two first conductive layers, wherein the charge storage structures in the vertically adjacent memory cells are separated from each other;
    forming a channel layer on a sidewall of the stacked structure, the channel layer being connected to the substrate; and
    forming a second dielectric layer between the channel layer and the first conductive layers,
    wherein a method of forming the stacked structure comprises:
    forming a first dielectric material layer on the substrate;
    alternately forming a plurality of first conductive material layers and a plurality of charge storage structure layers on the first dielectric material layer; and
    performing a patterning process on the first conductive material layers, the charge storage structure layers, and the first dielectric material layer, and
    wherein a method of forming each of the charge storage structure layers comprises:
    forming a third dielectric material layer on each of the first conductive material layers;
    forming a charge storage material layer on the third dielectric material layer; and
    forming a fourth dielectric material layer on the charge storage material layer.

11. The fabricating method according to claim 10, wherein the patterning process comprises forming an opening in the first conductive material layers, the charge storage structure layers, and the first dielectric material layer, and the opening exposes the substrate.

12. The fabricating method according to claim 11, wherein a method of forming the channel layer comprises:
    forming a spacer channel layer on the second dielectric layer on the sidewall of the stacked structure; and
    forming a primary channel layer, the opening being filled with the primary channel layer.

13. The fabricating method according to claim 10, further comprising forming a doped region in the substrate below the channel layer.

14. The fabricating method according to claim 10, further comprising forming a conductive wire on the stacked structure, the conductive wire being connected to the channel layer.

15. The fabricating method according to claim 14, wherein the conductive wire and the channel layer are integrally formed or independent from each other.

16. The fabricating method according to claim 10, further comprising forming a second conductive layer between the first dielectric layer and a bottommost first conductive layer of the first conductive layers in the stacked structure, the second conductive layer being electrically isolated from the bottommost first conductive layer in the stacked structure.

17. The fabricating method according to claim 10, further comprising forming a third conductive layer on a topmost first conductive layer of the first conductive layers in the stacked structure, the third conductive layer being electrically isolated from the topmost first conductive layer in the stacked structure.

* * * * *